United States Patent
Wei et al.

(10) Patent No.: US 8,434,034 B2
(45) Date of Patent: Apr. 30, 2013

(54) METHOD OF MAKING OPTICAL PROXIMITY CORRECTION TO ORIGINAL GATE PHOTOMASK PATTERN BASED ON DIFFERENT SUBSTRATE AREAS

(75) Inventors: Fang Wei, Shanghai (CN); Chenming Zhang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 13/339,411

(22) Filed: Dec. 29, 2011

(65) Prior Publication Data
US 2013/0067423 A1    Mar. 14, 2013

(30) Foreign Application Priority Data
Sep. 8, 2011  (CN) .......................... 2011 1 0265304

(51) Int. Cl.
*G06F 17/50*   (2006.01)
(52) U.S. Cl.
USPC .............................. 716/55; 716/132; 716/139
(58) Field of Classification Search .................... 716/55, 716/132, 139
See application file for complete search history.

(56) References Cited

U.S. PATENT DOCUMENTS
7,174,532 B2 *  2/2007  Chlipala et al. ................. 716/53
7,730,432 B1 *  6/2010  Gupta et al. ................... 716/135

\* cited by examiner

*Primary Examiner* — Thuan Do
(74) *Attorney, Agent, or Firm* — Renner, Otto, Boisselle & Sklar, LLP

(57) ABSTRACT

The present invention relates to the field of semiconductor manufacturing, and particularly to a method of making Optical Proximity Correction to an original gate photomask pattern based on different substrate areas. The present invention discloses a method of making OPC to an original gate photomask pattern based on different substrate areas, which makes correction to gate photomask pattern dimension on the AA and to gate photomask pattern dimension on the STI respectively by creating two different optical proximity effect models of the gate, so as to control the finally imaged gate photomask pattern dimensions more accurately; moreover, the error of the correction result of the gate spacing dimension on the STI can be reduced by 4% by separating the patterns and using the gate model based on the STI, so as to avoid the spacing dimension error when the photolithography exposure conditions vary.

3 Claims, 3 Drawing Sheets

METHOD OF MAKING OPTICAL PROXIMITY CORRECTION TO ORIGINAL GATE PHOTOMASK PATTERN BASED ON DIFFERENT SUBSTRATE AREAS

CROSS REFERENCE TO RELATED APPLICATIONS

This application is based upon and claims the benefit of priority from the prior Chinese Patent Application No. 201110265304.7 filed on Sep. 8, 2011, entitled "Method of Making Optical Proximity Correction based on Different Substrates" with Chinese State Intellectual Property Office, under 35 U.S.C. §119. The contents of the above prior Chinese Patent Application are incorporated herein by reference in its entirety.

FIELD OF THE INVENTION

The present invention relates to the field of semiconductor manufacturing, and particularly to a method of making Optical Proximity Correction (OPC) to an original gate photomask pattern based on different substrate areas.

BACKGROUND OF THE INVENTION

In the process of preparation technology of semiconductor devices, with the rapid development of ultra large scale integrated circuits, chip dimensions get smaller and smaller as the integration degree of chips gets higher and higher. In the process of chip preparation technology, Critical Dimension (CD) is smaller and smaller with the development of technology generation, so the requirement to photolithography technology is higher and higher. In advanced photolithography technology, because of the reduction of dimension of exposure patterns, it is needed to make Optical Proximity Correction (OPC) to photomask pattern in advance, so as to compensate optical proximity effect produced by limited resolution of an optical system. However, in traditional advanced integrated circuit technology, an optical model for making a model based OPC to gate photomask pattern is created based on Active Area (AA) solely.

As exposure patterns get smaller and smaller, the requirement for controlling gate dimension is more and more strict and the requirements to photolithography technology and OPC are higher and higher after the dimension of exposure patterns comes to 65 nm-technology. Slight differences among optical effects for different substrates have affected technology window for photolithography and performance of devices.

FIG. 1 is a layout for gate design in background of present invention. FIG. 2 is a simulation graph of gate spacing dimension corrected based on a model of the gate based on the Shallow-trench isolation (STI) in a situation that exposure conditions vary in background of present invention. As shown in FIGS. 1-2, because of small gate (poly) spacing dimension of the STI, line spacing dimension error (Bridge) is likely to occur when photolithography exposure conditions vary. FIG. 3 is a simulation graph of gate spacing dimension corrected based on a model of the gate based on the Active Area (AA) in the situation that exposure conditions vary. As shown in FIG. 3, spacing dimension error (Bridge) also occurs in the condition of only making correction based on the model of the AA. FIG. 4 is a simulation graph of gate characteristic dimension based on different substrate areas in the method of making OPC based on different substrate areas in background of present invention. As shown in FIG. 4, CDs have slight difference for different substrates.

As shown in FIGS. 3-4, in actual layouts, all of line-end spacings are on the STI. According to nowaday practice, OPC is made based on the OPC model of the AA for all patterns, i.e., correction is made by using the OPC model on the AA. Because of correction error caused by different substrates, the spacing dimension error may occur when the photolithography exposure conditions vary.

SUMMARY OF THE INVENTION

The present invention discloses a method of making Optical Proximity Correction to an original gate photomask pattern based on different substrate areas, the original gate photomask pattern comprising a gate photomask pattern on an active area and a gate photomask pattern on a shallow-trench isolation, wherein the method comprises the following steps:

step S1: based on the different substrate areas for gate photolithography, creating an optical proximity effect model of the gate based on the active area and an optical proximity effect model of the gate based on the shallow-trench isolation respectively;

step S2: after separating the gate photomask pattern on the active area of the original gate photomask pattern from the gate photomask pattern on the shallow-trench isolation of the original gate photomask pattern, making Optical Proximity Correction to the separated gate photomask pattern on the active area using the optical proximity effect model of the gate based on the active area, while making Optical Proximity Correction to the separated gate photomask pattern on the shallow-trench isolation using the optical proximity effect model of the gate based on the shallow-trench isolation;

step S3: combining the Optical Proximity Corrected gate photomask pattern on the active area with the Optical Proximity Corrected gate photomask pattern on the shallow-trench isolation to obtain a corrected gate photomask pattern.

In the above method of making Optical Proximity Correction to an original gate photomask pattern based on different substrate areas, making model based Optical Proximity Correction to the separated gate photomask pattern on the active area using the optical proximity effect model of the gate based on the active area.

In the above method of making Optical Proximity Correction to an original gate photomask pattern based on different substrate areas, making model based Optical Proximity Correction to the separated gate photomask pattern on the shallow-trench isolation using the optical proximity effect model of the gate based on the shallow-trench isolation.

In conclusion, by adopting the above technical solutions, the present invention provides a method of making OPC to an original gate photomask pattern based on different substrate areas, which makes correction to gate photomask pattern dimension on the AA and to gate photomask pattern dimension on the STI respectively by creating two different optical proximity effect models of the gate, so as to control the finally imaged gate photomask pattern dimensions more accurately; moreover, the error of the correction result of the gate spacing dimension on the STI can be reduced by 4% by separating the patterns and using the model based on the STI, so as to avoid the spacing dimension error when the photolithography exposure conditions vary.

DETAILED EMBODIMENTS OF THE INVENTION

Reference will be made further to the specific embodiments of the present invention in connection with the accompanying drawings.

Figure 1:
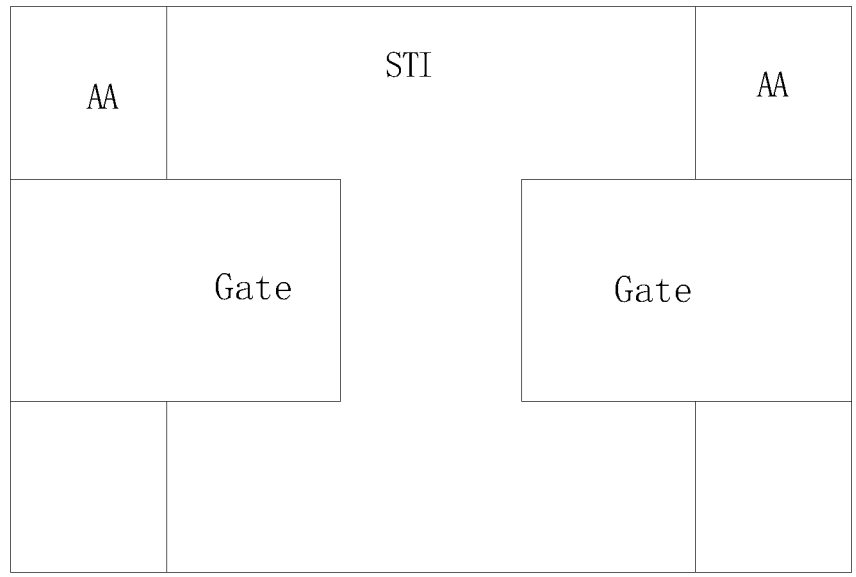
FIG. 1 is a layout for gate design in background of present invention.
Figure 2:
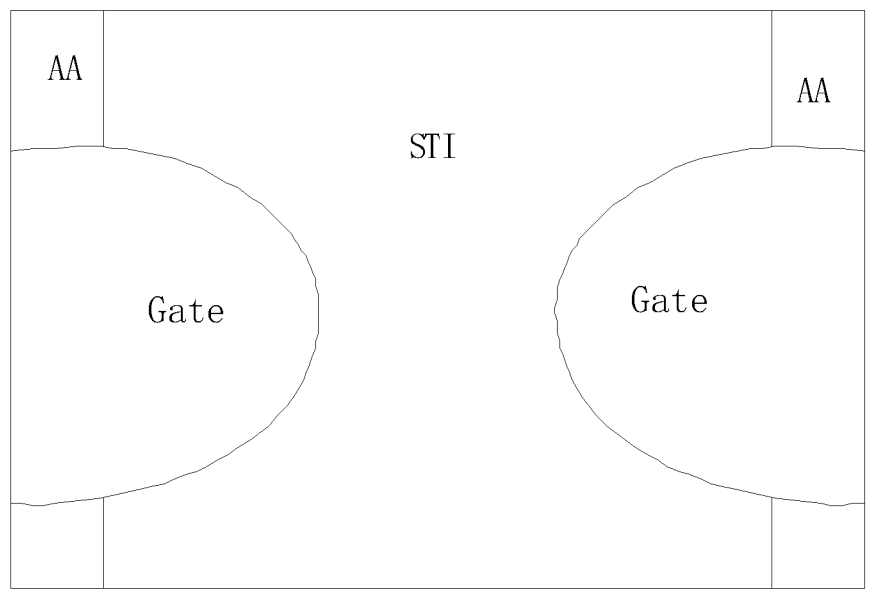
FIG. 2 is a simulation graph of gate spacing dimension corrected based on the model of the STI in the situation that exposure conditions vary in background of present invention.
Figure 3:
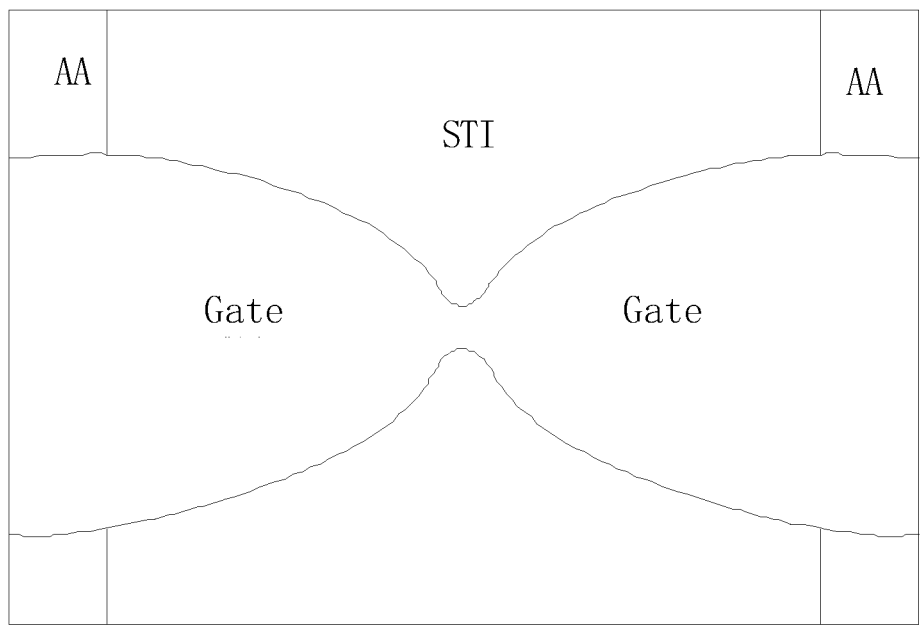
FIG. 3 is a simulation graph of gate spacing dimension corrected based on the model of the AA in the situation that exposure conditions vary in background of present invention.
Figure 4:
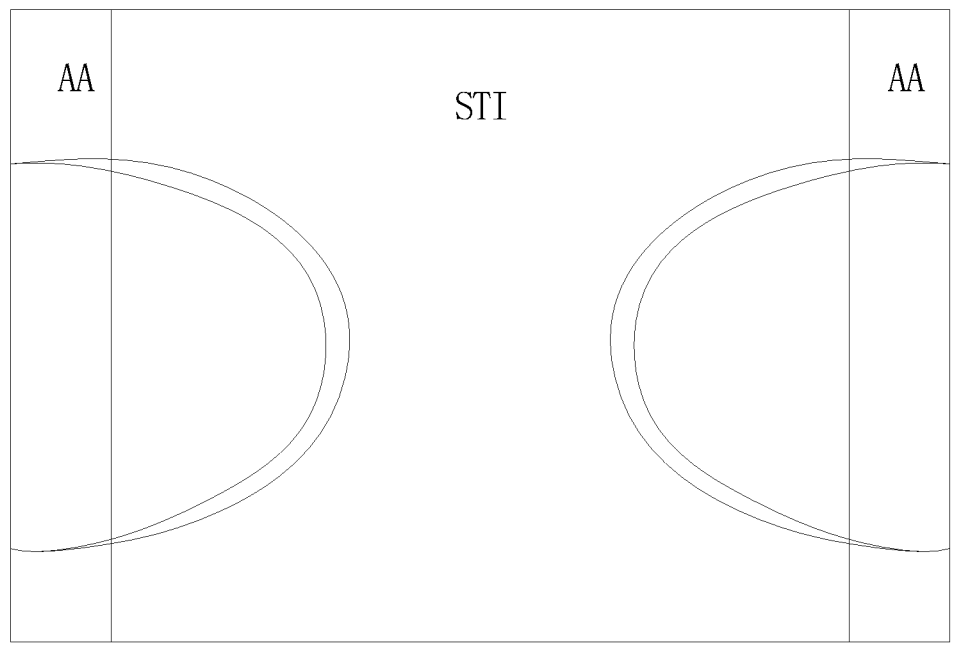
FIG. 4 is a simulation graph of gate characteristic dimension based on different substrate areas in the method of making OPC based on different substrate areas in background of present invention.
Figure 5:
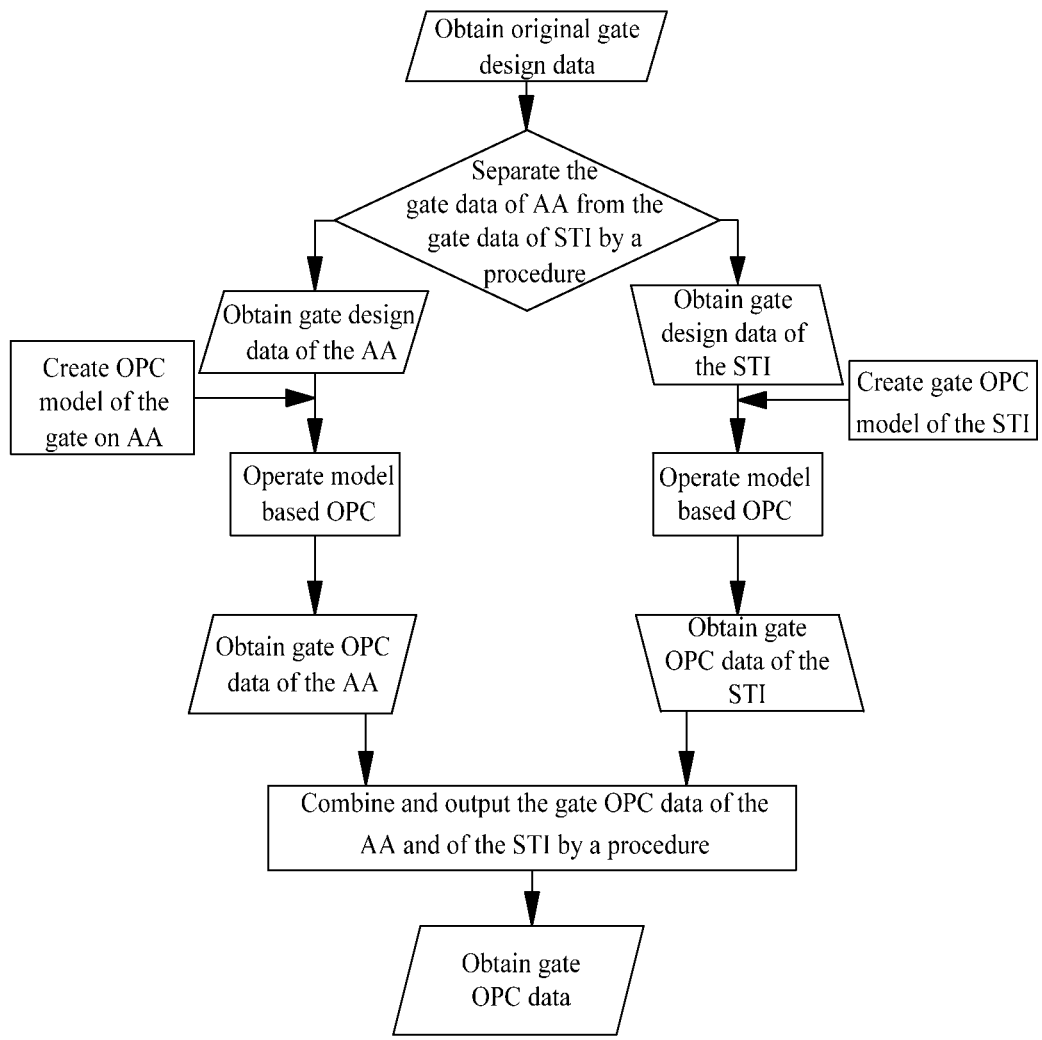
FIG. 5 is a simulation flow chart of the method of making OPC to an original gate photomask pattern based on different substrate areas according to the present invention.

FIG. 5 is a flow chart of the method of making OPC to an original gate photomask pattern based on different substrate areas according to the present invention. The original gate photomask pattern comprising a gate photomask pattern on an active area and a gate photomask pattern on a shallow-trench isolation. As shown in FIG. 5, firstly, based on the different substrate areas for gate photolithography, creating an optical proximity effect model of the gate based on the Active Area (AA) and an optical proximity effect model of the gate based on the Shallow-trench isolation (STI) respectively; then, designing data of original gate, and performing separation by a procedure to separate the data of original gate into gate design data of the STI area and gate design data of the AA.

Secondly, making a model based OPC to the gate design data of the AA by using the optical proximity effect model of the gate based on the AA, so as to obtain OPC data of the gate (Poly Post) of the AA; meanwhile, making another model based OPC to the gate design data of the STI by using the optical proximity effect model of the gate based on the STI, so as to obtain OPC data of the gate (Poly Post) of the STI.

Finally, performing a combination by a procedure, thereby combining the OPC data of the gate (Poly Post) of the AA with the OPC data of the gate (Poly Post) of the STI, which are obtained after the model based OPCs, so as to obtain final OPC data of the gate (Poly Post).

By separating the original design data of the original gate (Poly) into the gate design data on the AA and the gate design data on the STI, then making OPC individually, OPC based on the gate model of AA is made to the gate photomask pattern on the AA, and OPC based on the gate model of STI is made to the gate photomask pattern on the STI; and then, the two parts of corrected gate OPC data are combined and outputted.

In conclusion, by adopting the above technical solutions, the present invention provides a method of making OPC to an original gate photomask pattern based on different substrate areas, which makes correction to gate photomask pattern dimension on the AA and to gate photomask pattern dimension on the STI respectively by creating two different optical proximity effect models of the gate, so as to control the finally imaged gate photomask pattern dimensions more accurately; moreover, the error of the correction result of the gate spacing dimension on the STI can be reduced by 4% by separating the patterns and using the model based on the STI, so as to avoid the spacing dimension error when the photolithography exposure conditions vary.

"Performing separation by a procedure" means: in the Optical Proximity Correction, the pattern edge to be corrected is shifted, such that the gate photomask pattern edge is recognized and separated, by an OPC software, into a gate photomask pattern edge aggregation based on the active area and a gate photomask pattern edge aggregation based on the shallow-trench isolation.

In the Optical Proximity Correction made to the gate photomask pattern, the gate photomask pattern edge aggregation based on the active area is Optical Proximity Corrected by using the optical proximity effect model of the gate based on the active area, so as to form a post OPC gate photomask pattern edge aggregation based on the active area; while the gate photomask pattern edge aggregation based on the shallow-trench isolation is Optical Proximity Corrected by using the optical proximity effect model of the gate based on the shallow-trench isolation, so as to form a post OPC gate photomask pattern edge aggregation based on the shallow-trench isolation.

"Performing a combination by a procedure" means: a logical operation "OR" is applied, by the OPC software, to the post OPC gate photomask pattern edge aggregation based on the active area and the post OPC gate photomask pattern edge aggregation based on the shallow-trench isolation, so as to form a final post OPC gate photomask pattern edge aggregation, and the final post OPC gate photomask pattern edge aggregation is outputted, by the OPC software, as a layout file of the post OPC gate photomask pattern.

Although specific embodiments of the present invention have been described in detail above, the specific embodiments are only used as examples, and the present invention is not limited to the above-described specific embodiments. For those skilled in the art, various equivalents and modifications made to the invention fall within the scope of the present disclosure. Therefore, all the equivalents and modifications without departing from the spirit or scope of the invention should be included in the scope of the present invention.

What is claimed is:

1. A computer-implemented method of making Optical Proximity Correction to an original gate photomask pattern, the original gate photomask pattern being used for a gate on a substrate and comprising an active area gate photomask pattern and a shallow-trench isolation gate photomask pattern, characterized in that the method comprises:

creating a first optical proximity effect model of for the gate on an active area of the substrate and a second optical proximity effect model for the gate on a shallow-trench isolation of the substrate respectively;

separating the active area gate photomask pattern of the original gate photomask pattern from the shallow-trench isolation gate photomask pattern of the original gate photomask pattern;

making an Optical Proximity Correction to the separated active area gate photomask pattern using the first optical proximity effect model so as to obtain a corrected active area gate photomask pattern, while making an Optical Proximity Correction to the separated shallow-trench isolation gate photomask pattern using the second optical proximity effect model so as to obtain a corrected shallow-trench isolation gate photomask pattern;

combining the corrected active area gate photomask pattern with the corrected shallow-trench isolation gate photomask pattern to obtain a corrected gate photomask pattern to be used in photolithography process.

2. The computer-implemented method of making Optical Proximity Correction to an original gate photomask pattern according to claim 1, characterized in: making model based Optical Proximity Correction to the separated active area gate photomask pattern using the first optical proximity effect model.

3. The computer-implemented method of making Optical Proximity Correction to an original gate photomask according to claim 1, characterized in: making model based Optical Proximity Correction to the separated shallow-trench isolation gate photomask pattern using the second optical proximity effect model.

* * * * *